(12) United States Patent
Kawama et al.

(10) Patent No.: US 6,379,995 B1
(45) Date of Patent: Apr. 30, 2002

(54) METHOD OF MAKING A SOLAR BATTERY

(75) Inventors: Yoshitatsu Kawama; Hiroaki Morikawa; Katsuhiro Imada; Kazuyoshi Kojima, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/695,242

(22) Filed: Oct. 25, 2000

(30) Foreign Application Priority Data

May 12, 2000 (JP) ......................................... 2000-140074

(51) Int. Cl.[7] .......................... H01L 21/00; H01L 21/44
(52) U.S. Cl. ......................... 438/98; 438/72; 438/71; 438/677
(58) Field of Search .......................... 438/69, 70, 71, 438/72, 677, 98; 136/256, 259; 427/61, 63, 103, 123

(56) References Cited

U.S. PATENT DOCUMENTS 5,217,829 A * 6/1993 Nowak et al. ................. 430/5
6,036,889 A * 3/2000 Kydd ........................... 252/512
6,133,070 A * 10/2000 Yagi et al. ..................... 438/121
6,331,673 B1 * 12/2001 Kataoya et al. ............... 136/259

FOREIGN PATENT DOCUMENTS

JP        10-233581        9/1998

OTHER PUBLICATIONS

Niijs et al.; "Latest Efficiency Results with the Screenprinting Technology and Comparison with the Buried Contact Structure", IEEE First WCPEC, Dec. 5–9, 1994, pp. 1242–1249.

* cited by examiner

Primary Examiner—John F. Niebling
Assistant Examiner—Viktor Simkovic
(74) Attorney, Agent, or Firm—Leydig, Voit & Mayer, Ltd.

(57) ABSTRACT

A water-repellent layer is formed on a light-receiving surface of a solar battery prior to the formation of a coated-film electrode. The coated-film electrode is formed by screen-printing a coating solution on the water-repellent layer. The coating solution is restricted from spreading on the surface of the water-repellent layer and a narrow ridge-shaped coated-film electrode is formed. Thus, the front electrode is smaller in width and larger in height, so received light loss and transmission loss are decreased.

5 Claims, 12 Drawing Sheets ness of the invention will become more apparent from the following detailed description taken in conjunction with the preferred embodiments of the present invention described hereinbelow.
METHOD OF MAKING A SOLAR BATTERY

BACKGROUND OF THE INVENTION

1. Field of the Invention

The present invention relates to a method of producing a solar battery and, more particularly, to a solar battery capable of improving conversion efficiency by reducing received light loss and power transmission loss, and a method of producing the same.

2. Description of the Related Art

FIGS. 12A–12E are schematic sectional views of producing processes showing an example of a method of producing a solar battery widely used in solar power generation systems for residential buildings. First, a p-type silicon substrate 101 is wet-etched on the surface thereof by using a solution of potassium hydroxide or sodium hydroxide with a concentration in a range from 10% to 50%, thereby forming a texture. Then phosphorus is diffused in the surface of the p-type silicon substrate 101 thereby to form an n-type impurity diffused layer 102 over the entire surface of the p-type silicon substrate 101, and further an anti-reflective layer 103 made of silicon nitride is formed on the surface of the n-type impurity diffused layer 102 (FIG. 12A). Then the front surface of the anti-reflective layer 103 is coated with a silver paste by, for example, screen-printing, thereby to form a comb-shaped silver paste electrode 104' (FIG. 12B). Next, the back surface of the p-type semiconductor substrate 101 is coated with an aluminum paste by, for example, screen-printing thereby to form an aluminum paste electrode 105' (FIG. 12C). The silver paste electrode 104' and the aluminum paste electrode 105' are sintered by firing at a temperature not lower than 600° C., thereby to form a front electrode 104 and a back electrode 105 and complete a solar battery (FIG. 12D).

During the sintering process, silicon nitride contained in the anti-reflective layer 103 is molten and the silver paste electrode 104' penetrates through the anti-reflective layer 103 to reach the n-type impurity diffused layer 102, thereby establishing electrical continuity between the front electrode 104 and the n-type impurity diffusion layer 102. This technique is called fire-through process and is disclosed in, for example, Japanese Laid-open Patent Publication No. 10-233581.

FIG. 13 is a schematic perspective view showing the structure of a solar battery produced by the method described above. A plurality of front electrodes 104 having a ridge shape are disposed at predetermined spaces from each other on the surface of the n-type impurity diffused layer 102, and the anti-reflective layers 103 are disposed on both sides of the ridge-shaped front electrodes 104. The front electrode formed by the screen-printing process has a cross section of, for example, mountain-like shape 55 μm in width and about 15 μm in height (J. Nijs et al., *First World Conference on Photovoltaic Energy Conversion*, 1994, p.1242). The operation of the solar battery will be described below with reference to FIG. 14. Incident light 106 that has passed through the anti-reflective layer 103 and reached the p-type semiconductor substrate 101 generates a current 107. The current 107 is collected through the n-type impurity diffused layer 102 to the front electrode 104, and is taken out of the solar battery through the front electrode 104. In the drawing, detail of the texture is omitted in order to make the structure of the front electrode easier to comprehend.

As shown in FIG. 14, the front electrode 104 is opaque and therefore reflects the incident light 106 on the surface thereof, resulting in reduced light reception area and a loss in received light. Also because the front electrode 104 has an electrical resistance that is inversely proportional to the sectional area thereof, the electrode causes a transmission loss when taking out the current 107 to the outside. Consequently, it is necessary to decrease the width of the front electrode and increase the cross sectional area of the front electrode in order to reduce the received light loss and the transmission loss. For this purpose, the cross-section of the front electrode is preferably small in width and large in height.

However, there has been such a problem that, even when a silver paste electrode having a small width is formed by the screen-printing process or the like on the surface of the anti-reflective layer, the resultant front electrode that is formed has a flat cross section that is large in width. When the ratio of height to width is used as an index of sectional profile of the electrode, the electrode in the case of J. Nijs et al. quoted above has the ratio of height to width as small as 0.27, and it has been difficult to achieve a ratio greater than this value.

The present inventors have found that the cause of the front electrode being formed only in a flat cross section that is large in width is that the silver paste electrode spreads in the crosswise direction after printing. FIG. 15 is a schematic diagram showing the shape of the silver paste electrode, that was formed by the screen-printing process or the like on the surface of the anti-reflective layer, changing with time. The silver paste electrode 108' immediately after being printed spreads with time along the surface of the anti-reflective layer 103 in the crosswise direction by gravity, thereby turning to the flat silver paste electrode 104'. Although viscosity of the silver paste may be increased in order to restrict the lateral spreading, the increased viscosity increases the time taken to print the silver paste electrode, thus making it difficult to decrease the production cost.

SUMMARY OF THE INVENTION

An object of the present invention is to solve the problems described above and provide a solar battery reducing receiver light loss and power transmission loss, and a method of producing the same by controlling the sectional shape of the front electrode.

In order to achieve the object described above, the method of producing a solar battery of the present invention comprises the steps of stacking a semiconductor layer of second conductivity type and an anti-reflective layer on the surface of a semiconductor substrate of first conductivity type, forming a coated-film electrode by applying a coating solution containing an electrode material on the anti-reflective layer, and forming a front electrode that penetrates the anti-reflective layer and electrically connects with the semiconductor layer by firing the coated-film electrode, wherein a water-repellent layer is formed on the anti-reflective layer prior to the formation of the coated-film electrode, the coated-film electrode having a desired fine line is formed by printing the coating solution on the water-repellent layer, so that the coating solution is suppressed from spreading over the surface of the water-repellent layer, and the coated-film electrode of narrow ridge shape is thereby formed.

According to the method of the present invention, since the water-repellent layer is formed on the light receiving surface prior to the formation of the coated-film electrode, and the coated-film electrode is formed on the surface of the water-repellent layer by printing, the coating solution can be prevented from spreading along the surface of the water-repellent layer, thereby making it possible to form the coated-film electrode having small width. Specifically, although the coating solution is forced to spread along the surface of the water-repellent layer by the gravity during printing, the water-repellent layer is difficult to wet with the coating solution and the coating solution contracts to minimize the surface area thereof. Thus the narrow coated-film electrode is formed. The water-repellent layer in the present invention refers to a layer having not only water repellency that is difficult to wet with water solution but also oil repellency that is difficult to wet with an organic solvent. Consequently, a coating solution containing an electrode material and an organic solvent added as a dispersion medium also does not easily wet the water-repellent layer of the present invention.

Also according to the method of the present invention, the water-repellent layer may be removed from portion where the coated-film electrodes is to be formed, after the water-repellent layer has been formed. The portion where the water-repellent layer is removed becomes slots. When the coating solution is applied in the slots, steps in the slots function as a barrier to restrict the movement of the paste in the crosswise direction. This makes it possible to reduce the width and increase the height of the coated-film electrode.

Also according to the method of the present invention, the water-repellent layer may be removed except for the portion that would be right below the coated-film electrode, after forming the water-repellent layer. In case the water-repellent layer absorbs the incident light, removing the water-repellent layer reduces the light reception loss caused by the water-repellent layer.

Also according to the method of the present invention, the water-repellent layer may contain a fluorine-containing surfactant as a water-repellent material. High water repellency can be achieved with a small amount of the fluorine-containing surfactant.

Also according to the method of the present invention, the water-repellent layer may be removed through thermal decomposition in the step of firing the coated-film electrode. In case the water-repellent layer absorbs the incident light, removing the water-repellent layer reduces the light reception loss caused by the water-repellent layer.

The solar battery of the present invention comprises, a semiconductor substrate of first conductivity type, a semiconductor layer of second conductivity type and an anti-reflective layer that are stacked on the surface of the semiconductor substrate of first conductivity type, and a front electrode of narrow ridge shape that penetrates the anti-reflective layer and electrically connects with the semiconductor layer, wherein the ratio of height to width in a cross-section of a crosswise direction of the front electrode is 0.4 or greater. Since the front electrode can be made higher than that of the prior art, the area that is capable of receiving the incident light can be increased, thus making it possible to reduce the light reception loss and improve the conversion efficiency of the solar battery. Also because the cross sectional area of the front electrode can be increased, power transmission loss of current can also be reduced.

The ratio of height to width can be made greater than 0.6, thereby reducing the light reception loss and the power transmission loss further.

In the solar battery of the present invention, width of the front electrode is in a range from 30 to 120 $\mu$m, more preferably in a range from 30 to 70 $\mu$m.

The solar battery of the present invention may also include the water-repellent layers that are formed on the anti-reflective layer and interpose the ridge-shaped front electrodes. The water-repellent layers formed on the surface of the anti-reflective layer have the effect of restricting water from depositing thereon and preventing the anti-reflective layer from being stained.

In the solar battery of the present invention, the water-repellent layer may contain a fluorine-containing surfactant. Since the fluorine-containing surfactant is contained as the water-repellent material, the water-repellent layer has high water repellency and improves the effect of preventing the anti-reflective layer from being stained further.

BRIEF DESCRIPTION OF THE DRAWINGS

The above and other objects and features of the present invention will become more apparent from the following description of preferred embodiments thereof with reference to the accompanying drawings, throughout which like parts are designated by like reference numerals.

DESCRIPTION OF THE PREFERRED EMBODIMENTS

This application is based on application No.2000-140074 filed May. 12, 2000 in Japan, the content of which is incorporated hereinto by reference.

Embodiment 1

Figure 1:
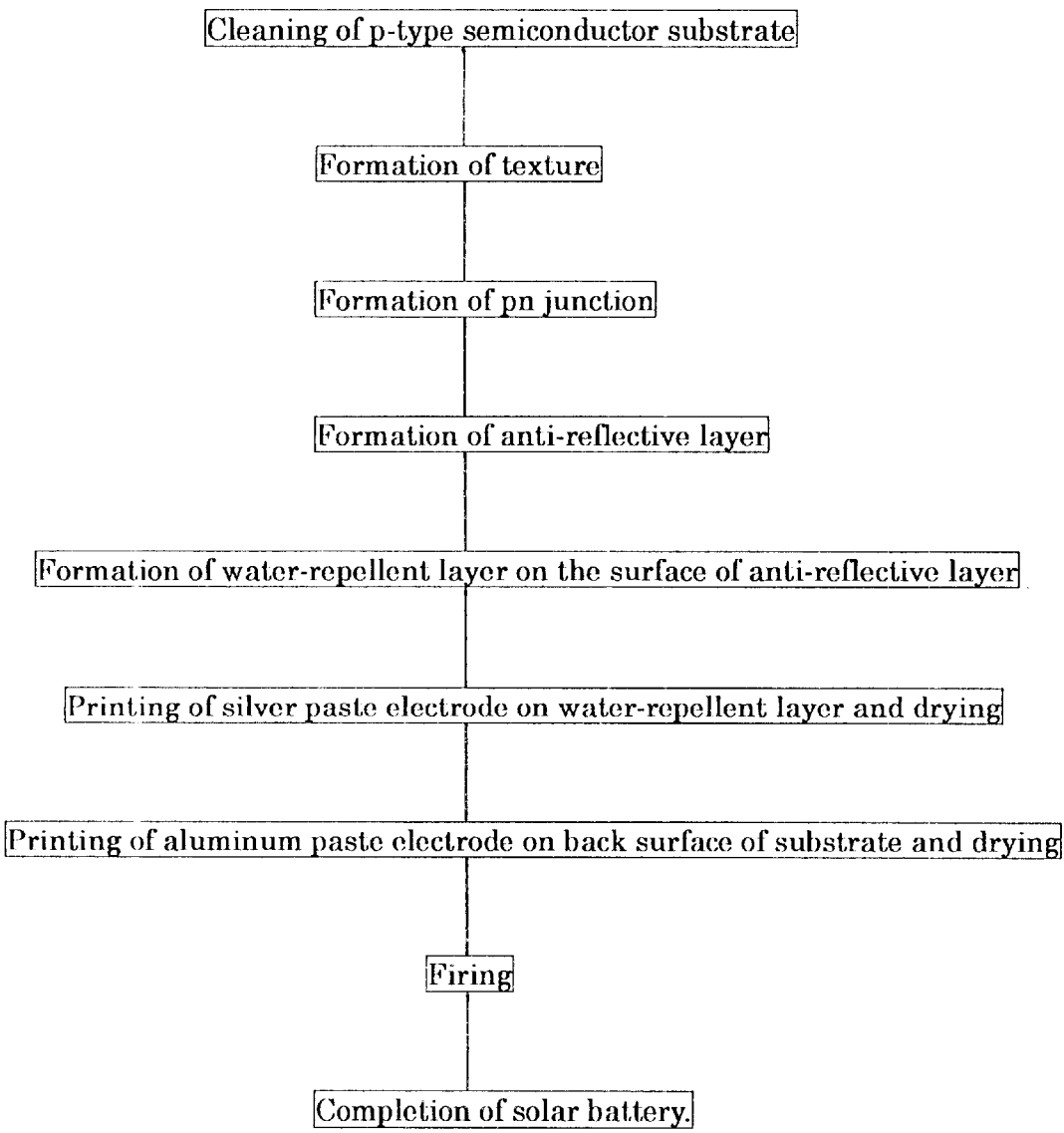
FIG. 1 is a flow chart showing a process of producing the solar battery according to the first embodiment of the present invention.

FIG. 1 is a flow chart showing the process of producing the solar battery according to the first embodiment of the present invention. First a p-type semiconductor substrate is cleaned and then a texture is formed thereon. By forming the texture consisting of microscopic unevenness, light incident on the surface of the solar battery undergoes random reflection, resulting in an effective decrease in the reflectivity and an improvement in the conversion efficiency. Then an n-type impurity diffusion layer is formed by thermal diffusion of phosphorus, and the anti-reflective layer is formed on the surface of the n-type impurity diffusion layer. Next a water-repellent layer is formed on the surface of the anti-reflective layer, a silver paste electrode is screen-printed on the surface of the water-repellent layer and is dried, followed by the formation of an aluminum paste electrode on the back surface of the p-type semiconductor substrate and drying thereof. Then the layered product is fired to complete the solar battery. The producing process will now be described in detail below with reference to the schematic sectional views of FIGS. 2A–2E.

In this embodiment, first the semiconductor substrate is cleaned. While a case of using a silicon substrate is described in this embodiment, other semiconductor substrates generally used in solar batteries such as GaAs and InP may also be used besides silicon. A single crystal silicon substrate made by the pulling process or a polycrystalline silicon substrate made by casting process may be used for the substrate of the solar battery, These substrates are frequently used as sliced from an ingot. In this case, in order to clear the substrate surface of flaws caused by wire saw or the like used in slicing and to clean the surface of stains caused during slicing of the wafer, the substrate surface is etched to a depth of about 10 to 20 $\mu$m by using an aqueous solution of alkali such as potassium hydroxide or sodium hydroxide, or a mixture of hydrofluoric acid and nitric acid. This may be followed by a process of cleaning the substrate with a mixture of hydrochloric acid and hydrogen peroxide, in order to remove heavy metals such as iron deposited on the substrate surface.

Then the texture is formed, by carrying out reactive ion etching for about 10 minutes under conditions of, for example, supplying 10 to 50 cc of chloride ($Cl_2$) gas, supplying RF power of 0.1 to 5 $W/cm^2$ and a pressure of 10 to 100 mTorr for an area of about 10 cm square, thereby to form microscopic unevenness. The texture may also be formed by wet etching of the substrate surface by using a 10 to 50% solution of potassium hydroxide or sodium hydroxide under the conditions of, for example, liquid temperature in a range from 50 to 90° C. and processing time of 60 minutes or less.

Then a pn junction is formed. For example, phosphorus oxychloride ($POCl_3$) is diffused over a p-type silicon substrate to form an n-type impurity diffusion layer. The n-type impurity diffusion layer may also be formed by ion injection of phosphorus, arsenic or the like.

Then the anti-reflective layer is formed. The anti-reflective layer decreases the reflectivity of the solar battery surface to the incident light, thereby greatly increasing the current generated by the incident light and improving the conversion efficiency. The anti-reflective layer may be formed from, for example, silicon nitride. Thickness of the silicon nitride film depends on the refractive index thereof, and is preferably in a range from about 700 to 800 Å for a refractive index of about 1.9 to 2.0. The silicon nitride film is formed by the low-pressure thermal CVD process or the plasma CVD process. The n-type impurity diffusion layer 2 and the anti-reflective layer 3 are formed on the surface of the p-type silicon substrate 1 in the process described above (FIG. 2A).

Figure 2A:
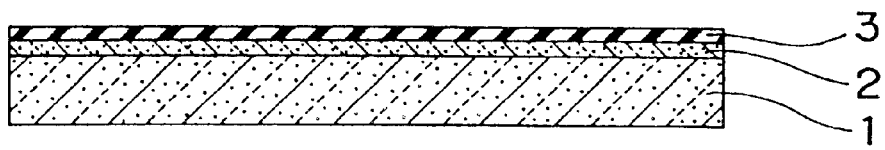
FIGS. 2A–2E are schematic sectional views showing the process of producing the solar battery according to the first embodiment of the present invention.
Figure 2B:
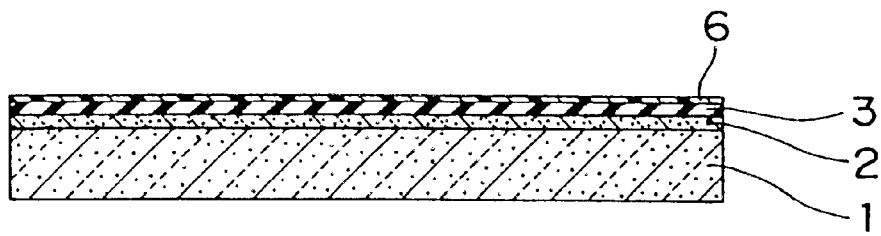

Then the water-repellent layer 6 is formed on the surface of the anti-reflective layer 3 (FIG. 2B). The water-repellent containing the water-repellent material over the entire surface of the anti-reflective layer 3 by spin coating, spraying or dipping process, and then drying the coating solution. Thickness of the water-repellent layer is preferably in a range from 0.1 to 10 $\mu$m, more preferably in a range from 0.1 to 2 $\mu$m. This is because sufficient water repellency cannot be obtained when the water-repellent layer is thinner than 0.1 $\mu$m, and absorption of the incident light by the water-repellent layer becomes significant when thicker than 10 $\mu$m.

For the water-repellent material, a fluorine-containing surfactant is preferably used. The fluorine-containing surfactant has high water repellency even with a low concentration. For the fluorine-containing surfactant of the present invention, a known surfactant that has fluoroalkyl group or perfluoroalkyl group as the hydrophobic group may be used.

Figure 2C:
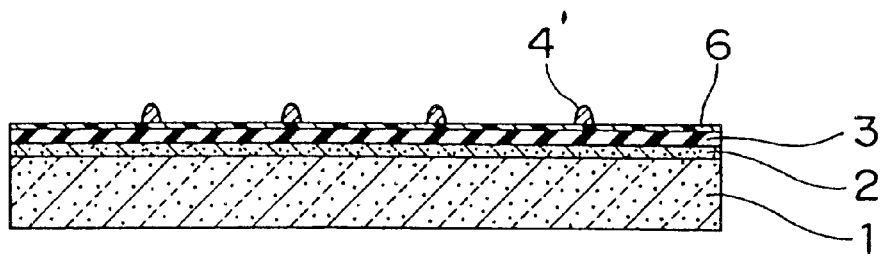

Then the silver paste electrode 4' is formed on the surface of the water-repellent layer 6 (FIG. 2C). The screen-printing process forms the silver paste electrode 4' in a comb-shaped pattern, for example. Width of the silver paste electrode 4' is preferably in a range from 30 to 120 $\mu$m, more preferably from 30 to 70 $\mu$m. This is because contribution to the reduction of light reception loss cannot be obtained when wider than 120 $\mu$m, and contribution to the reduction of power transmission loss cannot be obtained due to small sectional area when narrower than 30 $\mu$m.

Figure 2D:
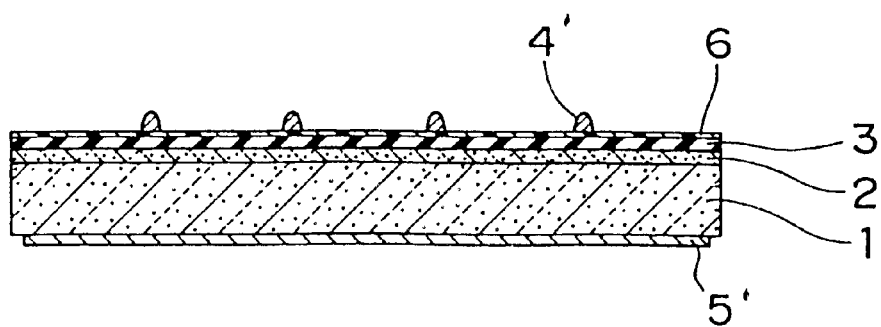

Then an aluminum paste electrode 5' is formed on the back surface of the p-type semiconductor substrate 1 (FIG. 2D). The aluminum paste electrode 5' is formed, for example, through patterning by the screen-printing process. A silver paste electrode may also be used instead of the aluminum paste electrode.

Figure 2E:
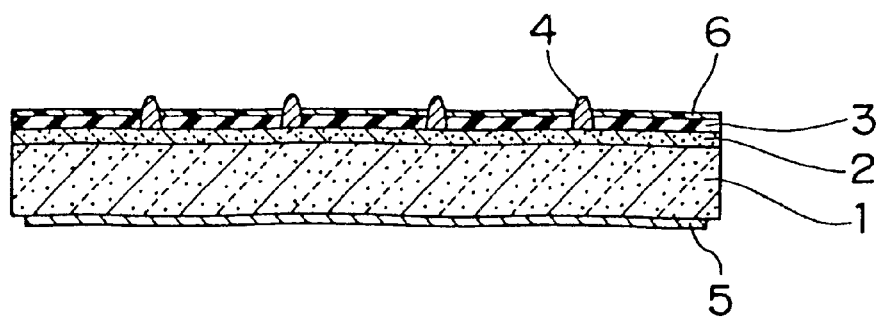

The silver paste electrode 4' and the aluminum paste electrode 5' are fired to sinter, thereby to turn into the front electrode 4 and the back electrode 5, respectively (FIG. 2E). Firing is carried out by heating to a temperature higher than 600° C., for example, in a range from 700 to 800° C. for several tens of seconds to several minutes in dry air atmosphere. Aluminum contained in the aluminum paste electrode diffuses into the p-type silicon substrate, thus achieving ohmic contact between the back electrode and the p-type silicon substrate.

The front electrode is formed in the fire-through process. That is, the silver paste electrode is heated to melt and erode the anti-reflective layer made of silicon nitride. The silver paste electrode then penetrates the anti-reflective layer to become the front electrode, and electrically connects with the n-type impurity diffusion layer. The silver paste electrode used in the fire-through process may contain a glass component in the state of frit, for example, disclosed in Japanese Laid-open Patent Publication No. 10-23518 mixed therein. Namely, a glass component mainly consisting of 5 to 30% of lead (Pb), 5 to 10% of boron (B), 5 to 15% of silicon (Si) and 30 to 60% of oxygen (O) may be used. In addition to the glass component, an appropriate amount of organic solvent such as diethylene glycol monobutyl ether or diethylene glycol monomethyl ether may be added to the silver paste and used after adjusting the viscosity to such a level that allows the screen-printing operation.

Figure 3:
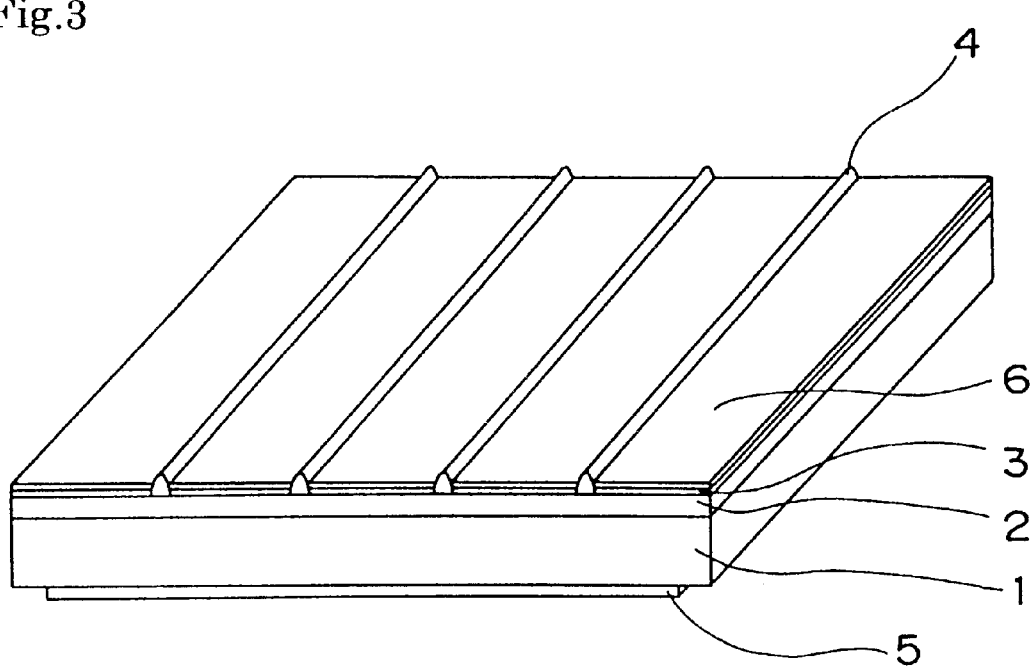
FIG. 3 is a schematic perspective view showing the structure of the solar battery according to the first embodiment of the present invention.

FIG. 3 is a schematic perspective view showing the structure of a solar battery fabricated in the process described above. Formed on the surface of the n-type impurity diffusion layer 2 are a plurality of front electrodes 4 of ridge shape extending in the longitudinal direction while penetrating the water-repellent layer 6 and the anti-reflective layer 3.

According to this embodiment, since the water-repellent layer is formed on the surface of the anti-reflective layer and the surface of the water-repellent layer is covered with the silver paste electrode, the silver paste can be restricted from spreading along the surface of the water-repellent layer and the electrode can be made smaller in width and larger in height than in the prior art. This increases the effective area of the light-receiving surface of the solar battery and improves the conversion efficiency. Moreover, since the cross sectional area of the front electrode can be increased, transmission loss can also be decreased. Also because the water-repellent layer makes it difficult for dust and water to deposit thereon, it is made possible to prevent the anti-reflective layer from being stained, thereby preventing the conversion efficiency from decreasing.

Figure 4:
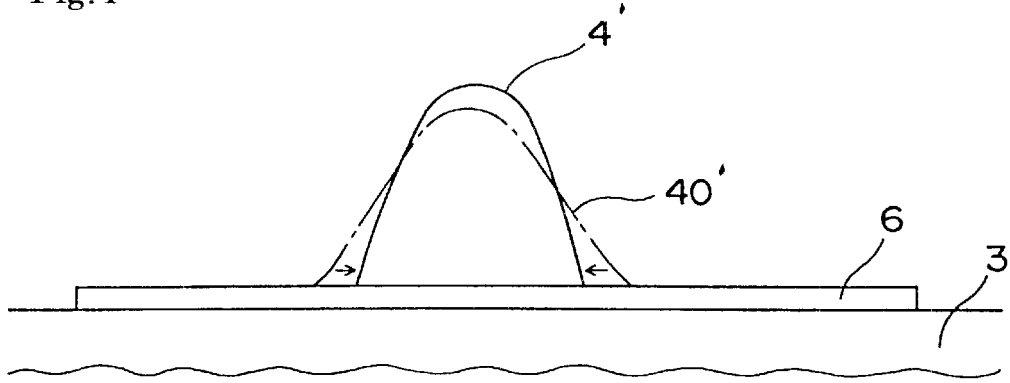
FIG. 4 is a schematic diagram showing the cross sectional configuration of the silver paste electrode according to the first embodiment of the present invention.

FIG. 4 schematically shows the sectional configuration of the silver paste electrode applied by printing on the surface of the water-repellent layer. Reference numeral 40' indicates the cross sectional configuration of the silver paste electrode immediately after making contact with the water-repellent layer 6, and numeral 4' indicates the cross sectional configuration of the silver paste electrode after being printed. The silver paste electrode is forced to spread along the water-repellent layer in the crosswise direction by the gravity immediately upon making contact with the water-repellent layer. However, since the water-repellent layer repels the silver paste, the silver paste contracts to minimize the surface area thereof by surface tension. The surface tension prevents the silver paste from extending beyond the width of the printed line. Moreover, even a silver paste electrode narrower than the width of the printed line can also be formed.

Figure 5:
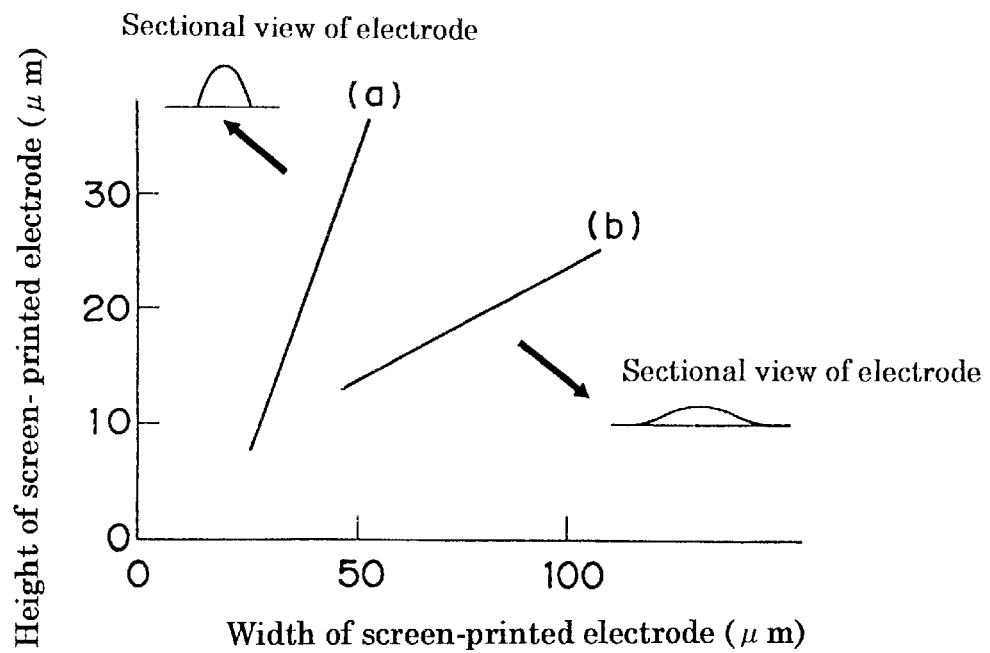
FIG. 5 is a graph showing the relationship between width and height of the cross-section of the screenprinted silver paste electrode according to the first embodiment of the present invention.

FIG. 5 shows the result of an experimental study on the relation between width and height of the front electrode. The line (a) in FIG. 5 shows a case where the water-repellent layer was formed by the method of this embodiment, and the line (b) in FIG. 5 shows a case where the water-repellent layer was not formed. FLORADE FC-726 manufactured by Sumitomo 3M Co., Ltd. was used for the fluorine-containing surfactant of the water-repellent material. In the case of prior art without the water-repellent layer, lower limit of width of the electrode that can be printed is about 50 $\mu$m, and the height is about 13 $\mu$m at this time. When the water-repellent layer is provided, on the other hand, the height can be increased to about 38 $\mu$m when the width of printing is 50 $\mu$m. Ratio of the height to the width when the width of printing is 50 $\mu$m is 0.26 in case the water-repellent layer is not provided, and is 0.76 in case the water-repellent layer is provided, nearly three times that of the former case. This is the result of the effect of the water-repellent layer restricting the silver paste from spreading. Forming the water-repellent layer also makes it possible to form the silver paste electrode narrower than the prior art, and form the front electrode having a width of about 30 $\mu$m.

In order to make it easier to understand the effects of the present invention, detail of the texture formed on the substrate surface is omitted in the drawing. It will be apparent, however, that the effects of the present invention can be achieved regardless of whether the texture is provided or not.

Embodiment 2

Figure 6A:
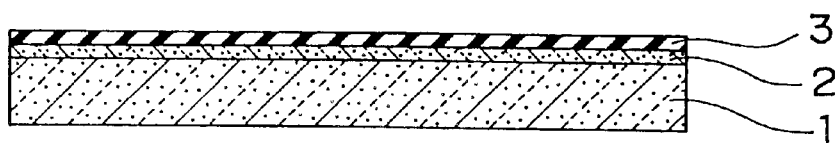
FIGS. 6A–6F are schematic sectional views showing a process of producing the solar battery according to the second embodiment of the present invention.

FIGS. 6A–6F are schematic sectional views showing a process of producing the solar battery according to this embodiment. In this embodiment, the solar battery can be produced in the same manner in the first embodiment except for forming slots in the water-repellent layer for forming the silver paste electrode. First, a texture is formed on a p-type semiconductor substrate that has been cleaned. Then an n-type impurity diffusion layer is formed by thermal diffusion of phosphorus, and the anti-reflective layer is formed on the surface of the n-type impurity diffusion layer. Thus the n-type impurity diffusion layer 2 and the anti-reflective layer 3 are formed one on another on the surface of the p-type silicon substrate 1 (FIG. 6A).

Figure 6B:
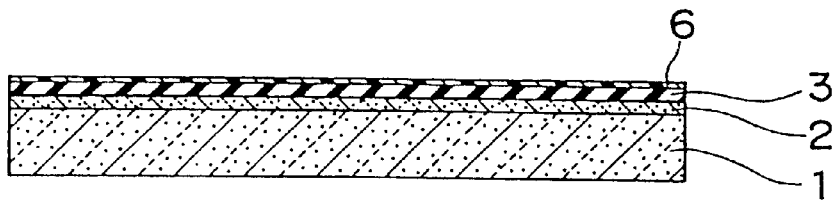

Then a coating solution containing the fluorine-containing surfactant is sprayed onto the surface of the anti-reflective layer 3, thereby to form the water-repellent layer 6 (FIG. 6B).

Figure 6C:
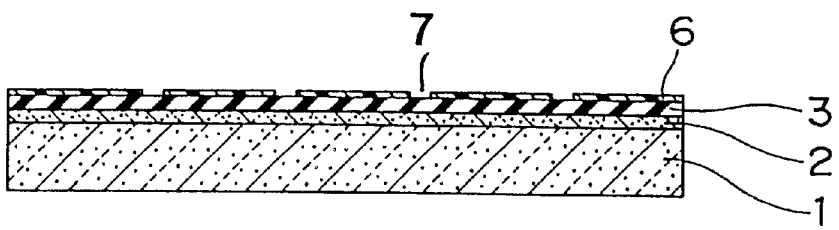

A mask of a desired pattern is formed on the surface of the water-repellent layer 6. Part of the water-repellent layer other than that right below the mask is removed by reactive ion etching, thereby to form slots 7 through which the anti-reflective layer 3 is exposed (FIG. 6C). Width of the slot 7 is set to be equal to that of the silver paste electrode.

Figure 6D:
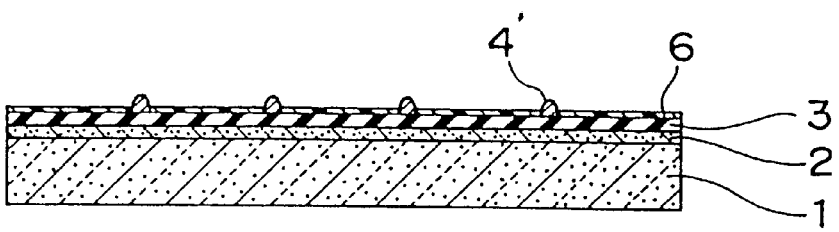
Figure 7:
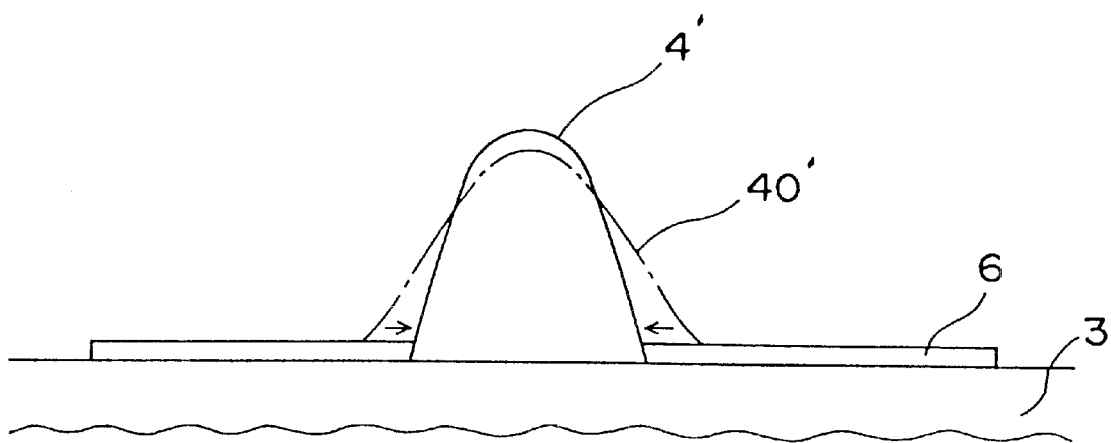
FIG. 7 is a schematic diagram showing the cross sectional configuration of the silver paste electrode according to the second embodiment of the present invention.

Then the silver paste electrode 4' are formed in the slots 7 and dried (FIG. 6D). FIG. 7 schematically shows the sectional configuration of the silver paste electrodes formed in the slots 7. Reference numeral 40' indicates the cross sectional configuration of the silver paste electrode immediately after making contact with the water-repellent layer 6, and numeral 4' indicates the cross sectional configuration of the silver paste electrodes after being printed. The silver paste is forced to spread in the crosswise direction along the water-repellent layer by the gravity immediately after making contact with the water-repellent layer. However, since the water-repellent layer repels the silver paste, the silver pastes contracts to minimize the surface area thereof, and the steps in the slit act as barriers to prevent the paste from spreading.

Figure 6E:
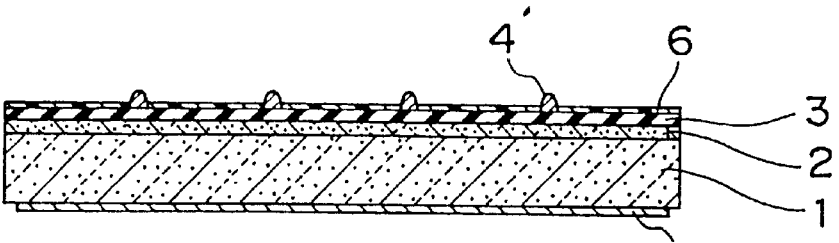

Then an aluminum paste electrode 5' is formed on the back surface of the p-type semiconductor substrate 1 (FIG. 6E). The aluminum paste electrode 5' is formed, for example, by patterning in the screen-printing process. A silver aluminum paste electrode may also be used instead of the aluminum paste electrode.

Figure 6F:
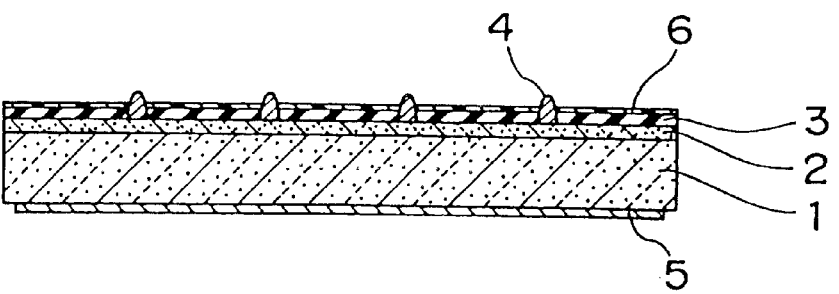

The silver paste electrode 4' and the aluminum paste electrode 5' are fired to sinter, thereby to turn into the front electrode and the back electrode, respectively (FIG. 6F). Firing is carried out by heating to a temperature higher than 600° C., for example, in a range from 700 to 800° C. for several tens of seconds to several minutes in dry air atmosphere. Aluminum contained in the aluminum paste electrode diffuses into the p-type silicon substrate, thus achieving ohmic contact between the back electrode and the p-type silicon substrate.

The front electrode is formed in the fire-through process. That is, the silver paste electrode is heated to melt and erode the anti-reflective layer that is made of silicon nitride. The silver paste electrode then penetrates the anti-reflective layer to become the front electrode, and electrically connects with the n-type impurity diffusion layer.

According to this embodiment, since the water-repellent layer is formed on the surface of the anti-reflective layer and the slots are made in the water-repellent layer to form the silver paste electrodes therein, the silver paste can be prevented from spreading along the surface of the water-repellent layer while the slots act as barriers to prevent the paste from spreading in the direction of with, thus it is made possible to make the electrode smaller in width and larger in height than in the prior art. This increases the effective area of the light-receiving surface of the solar battery and improves the conversion efficiency. Moreover, since the cross sectional area of the front electrode can be increased, transmission loss can also be decreased. Also because the water-repellent layer makes it difficult for dust and water to deposit thereon, it is made possible to prevent the anti-reflective layer from being stained, thereby preventing the conversion efficiency from decreasing.

In case a water-repellent material having a high thermal decomposition temperature is used, there may occur such a problem that the water-repellent material does not burn out completely in the fire-through process and remain between the front electrode and the impurity diffusion layer, thus increasing the contact resistance between the front electrode and the impurity diffusion layer. According to this embodiment, however, since there is not the water-repellent material in the slots, product of thermal decomposition of the water-repellent material does not remain between the electrode and the impurity diffusion layer. Consequently, the contact resistance between the front electrode and the impurity diffusion layer does not increase even when a water-repellent material having a high thermal decomposition temperature is used.

In order to make it easier to understand the effect of the present invention, detail of the texture formed on the substrate surface is omitted in the drawing. It will be apparent, however, that the effects of the present invention can be achieved regardless of whether the texture is provided or not.

Embodiment 3

Figure 8A:
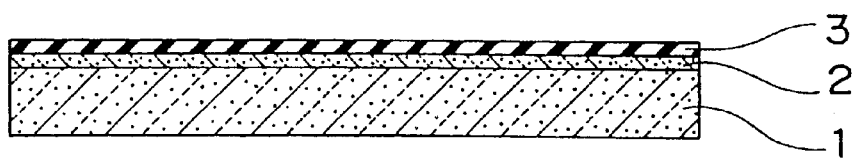
FIGS. 8A–8F are schematic sectional views showing a process of producing the solar battery according to the third embodiment of the present invention.

FIGS. 8A–8F are schematic sectional views showing a process of producing the solar battery according to this embodiment. In this embodiment, the solar battery can be produced in the same manner as in the first embodiment except for forming the water-repellent layer in the form of a plurality of ridges and forming silver paste electrodes thereon. First, a texture is formed on a p-type semiconductor substrate that has been cleaned. Then an n-type impurity diffusion layer is formed by thermal diffusion of phosphorus, and the anti-reflective layer is formed on the surface of the n-type impurity diffusion layer. Thus the n-type impurity diffusion layer 2 and the anti-reflective layer 3 are formed one on another on the surface of the p-type silicon substrate 1 (FIG. 8A).

Figure 8B:
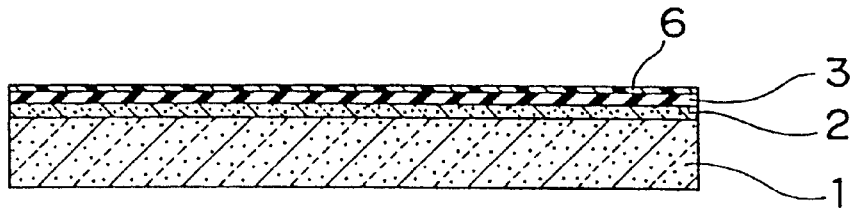

Then a coating solution containing the fluorine-containing surfactant is sprayed onto the surface of the anti-reflective layer 3, thereby to form the water-repellent layer 6 (FIG. 8B).

Figure 8C:
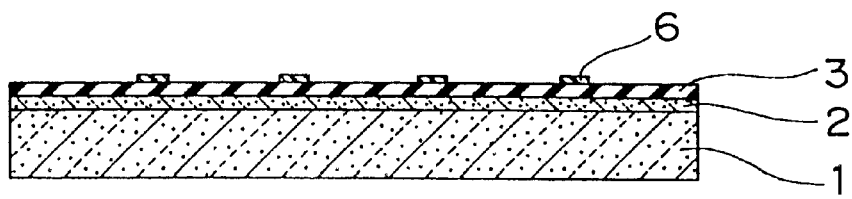

A mask is formed on the surface of the water-repellent layer 6. Part of the water-repellent layer 6 other than that right below the mask is removed by reactive ion etching, thereby to form a plurality of ridge-shaped water-repellent layers 6 (FIG. 8C). Width of the ridge-shaped water-repellent layer 6 is set to be equal to or greater than the width of the silver paste electrode.

Figure 8D:
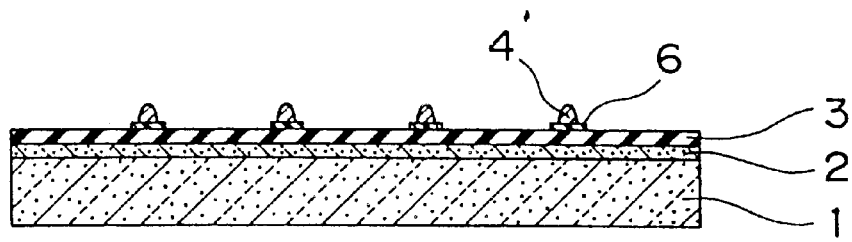
Figure 11:
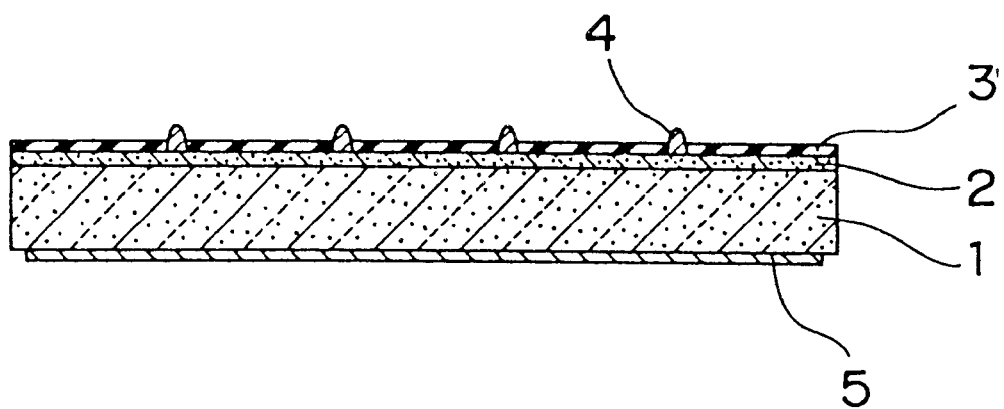
FIG. 11 is a schematic sectional view showing the structure of the solar battery according to a variation of the first to third embodiments of the present invention.
Figure 12A:
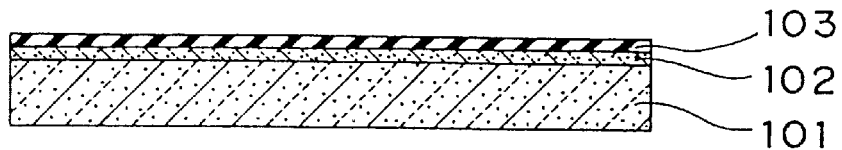
FIGS. 12A–12D are schematic sectional views showing a process of producing the solar battery of the prior art.
Figure 12B:
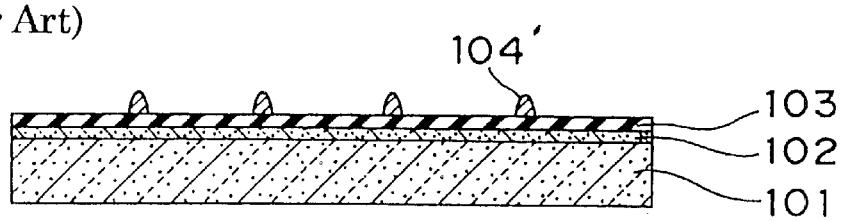
Figure 12C:
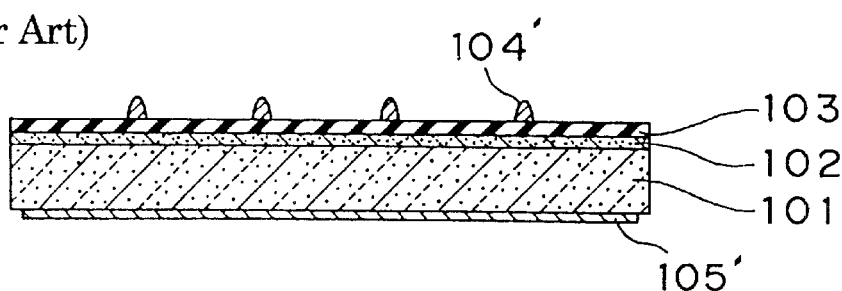
Figure 12D:
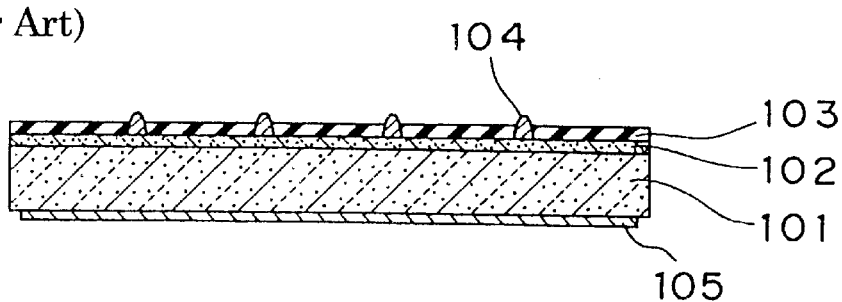
Figure 13:
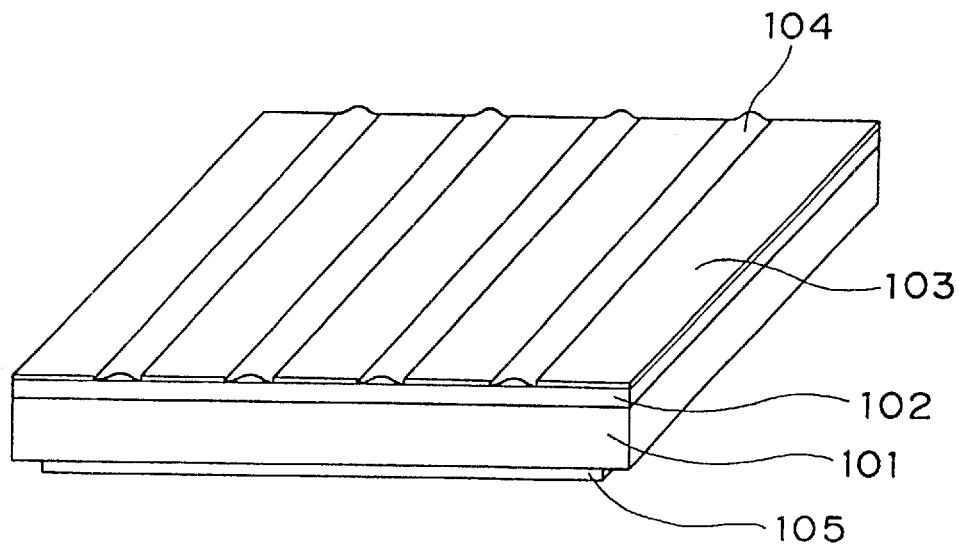
FIG. 13 is a schematic perspective view showing the structure of the solar battery of the prior art.
Figure 14:
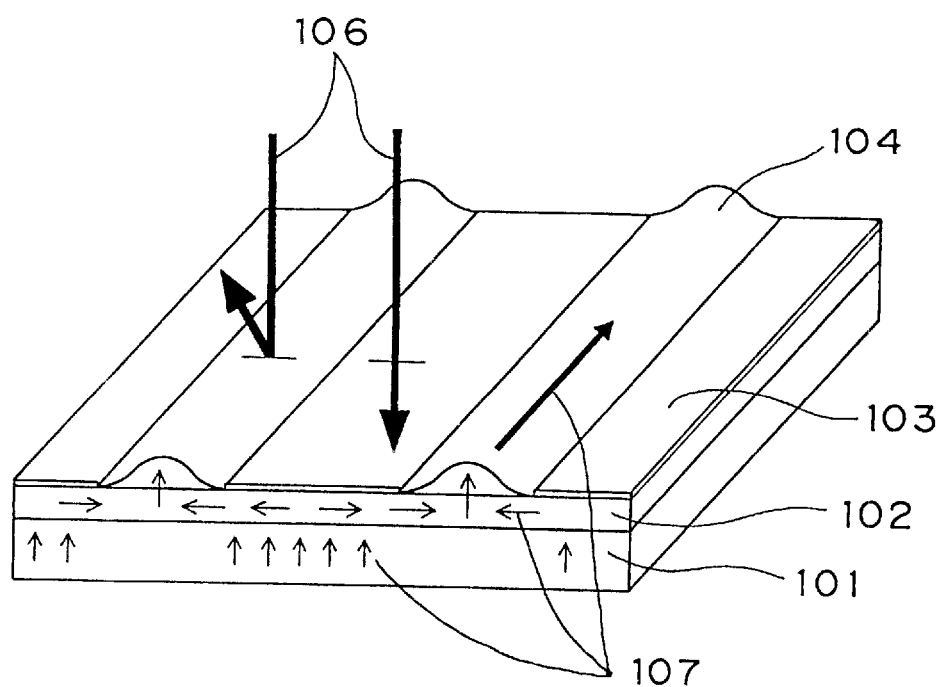
FIG. 14 is a schematic perspective view showing the state of light reception and charge collection in the solar battery of the prior art.
Figure 15:
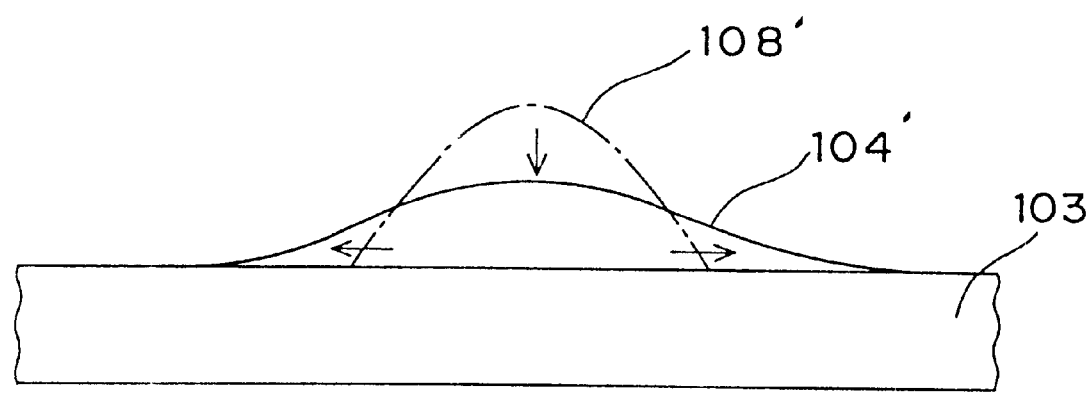
FIG. 15 is a schematic diagram showing the cross sectional configuration of the silver paste electrode of the prior art.

Then the silver paste electrode 4' are formed on the ridge-shaped water-repellent layers 6 by screen-printing and dried (FIG. 8D). FIG. 11 schematically shows the sectional configuration of the silver paste electrode formed on the ridge-shaped water-repellent layers 6. Reference numeral 40' indicates the cross sectional configuration of the silver paste electrode immediately after making contact with the ridge-shaped water-repellent layers 6, and numeral 4' indicates the cross sectional configuration of the silver paste electrode after being printed. The silver paste electrode is forced to spread in the crosswise direction along the water-repellent layer by the gravity immediately after making contact with the water-repellent layer. However, since the water-repellent layer repels the silver paste, the silver paste contracts to minimize the surface area thereof, thereby to prevent the paste from spreading.

Figure 8E:
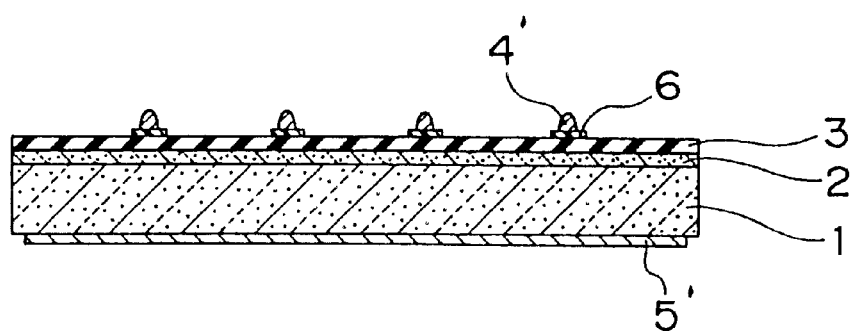

Then the aluminum paste electrode 5' is formed on the back surface of the p-type semiconductor substrate 1 (FIG. 8E). The aluminum paste electrode 5' is formed, for example, by patterning in the screen-printing process. A silver aluminum paste electrode may also be used instead of the aluminum paste electrode.

Figure 8F:
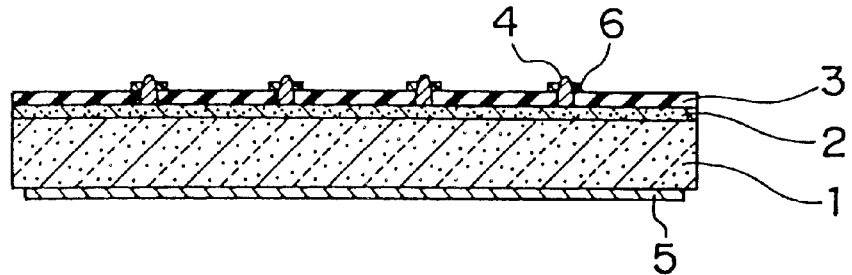

The silver paste electrode 4' and the aluminum paste electrode 5' are fired to sinter, thereby to turn into the front electrode and the back electrode, respectively (FIG. 8F). Firing is carried out by heating to a temperature higher than 600° C., for example, in a range from 700 to 800° C. for several tens of seconds to several minutes in dry air atmosphere. Aluminum contained in the aluminum paste electrode diffuses into the p-type silicon substrate, thus achieving ohmic contact between the back electrode and the p-type silicon substrate.

The front electrode is formed in the fire-through process. That is, the silver paste electrode is heated to melt and erode the anti-reflective layer made of silicon nitride. The silver paste electrode then penetrates the anti-reflective layer to become the front electrode, and electrically connects with the n-type impurity diffusion layer.

Figure 9:
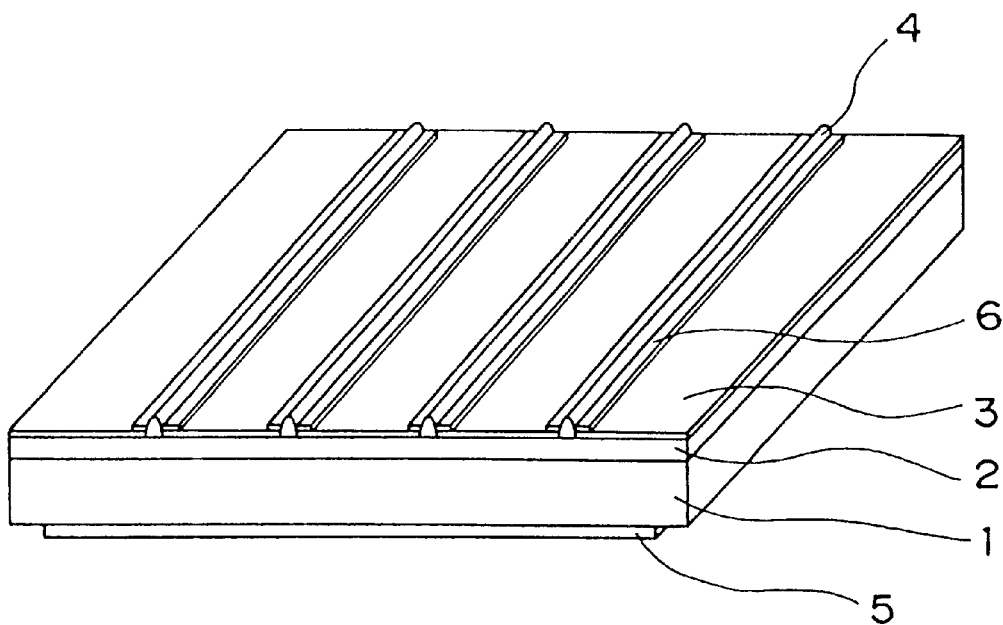
FIG. 9 is a schematic perspective view showing the structure of the solar battery according to the third embodiment of the present invention.
Figure 10:
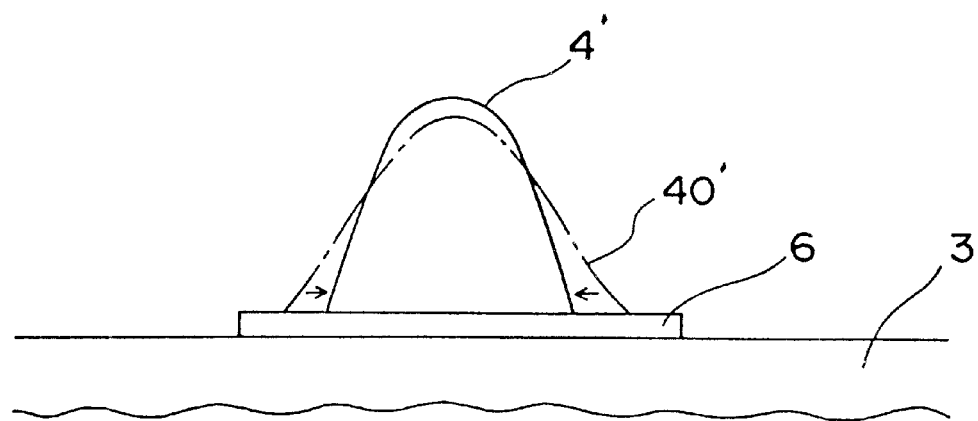
FIG. 10 is a schematic diagram showing the cross sectional configuration of the silver paste electrode according to the third embodiment of the present invention.

FIG. 9 schematically shows the structure of the solar battery produced in the process of this embodiment. The plurality of ridge-shaped front electrodes 4 are formed on the surface of the anti-reflective layer 3 and narrow water-repellent layers 6 are formed on both sides of the front electrodes 4, to extend in the longitudinal direction of the front electrode 4.

According to this embodiment, since the plurality of ridge-shaped water-repellent layer are formed on the surface of the anti-reflective layer and the silver paste electrodes are formed on the surface of the ridge-shaped water-repellent layer, the silver paste can be prevented from spreading along the surface of the water-repellent layer, and the electrode can be made smaller in width and larger in height. Also because the area of the water-repellent layer can be decreased, absorption of the incident light by the water-repellent material can be restricted. This increases the effective area of the light-receiving surface of the solar battery and improves the conversion efficiency. Moreover, since the cross sectional area of the front electrode can be increased, transmission loss can also be decreased.

In order to make it easier to understand the effects of the present invention, detail of the texture formed on the substrate surface is omitted in the drawing. It will be apparent, however, that the effects of the present invention can be achieved regardless of whether the texture is provided or not.

While the solar battery having the water-repellent layer has been described in the first through third embodiments, the present invention also includes a solar battery with the water-repellent layer being removed, as a variation of the first to third embodiment. FIG. 11 is a schematic sectional view showing the structure of the solar battery with the water-repellent layer removed. Formed on the surface of the n-type impurity diffusion layer 2 are the plurality of the front electrodes 4 of ridge shape extending in the longitudinal direction while penetrating the anti-reflective layer 3. When a fluorine-containing surfactant that can be thermally decomposed and removed at a temperature not higher than 600° C. is used, the water-repellent layer can be removed at the same time as the paste electrodes are fired.

As described above, since the water-repellent layer is formed on the light receiving surface prior to the formation of the coated-film electrode and the coating solution containing the electrode material is printed in a desired pattern of fine lines on the water-repellent layer in the process of producing the solar battery according to the present invention, the coating solution can be restricted from spreading along the surface of the water-repellent layer and the narrow ridge-shaped coated-film electrode can be formed. Thus the front electrode can be made smaller in width and larger in height, while the light reception loss and the transmission loss can be decreased, According to the method of the present invention, since the water-repellent layer is removed from the portion where the coated-film electrode is to be formed and the slot is made after forming the water-repellent layer, movement of the coating solution is restricted by the steps of the slots, and the front electrode can be made smaller in width and larger in height.

Also according to the method of the present invention, since the water-repellent layer is removed from the portion other than that right below the coated-film electrode after forming the water-repellent layer, absorption of the incident light by the water-repellent layer can be prevented.

Also according to the method of the present invention, since the water-repellent layer contains the fluorine-containing surfactant as the water-repellent material, even the water-repellent layer made in a thin film has sufficient water repellency.

Also according to the method of the present invention, since the water-repellent layer is burned out when firing the coated-film electrode, absorption of the incident light by the water-repellent layer can be prevented.

Since the solar battery of the present invention is made so that the ratio of height to width of the cross section of the front electrode is 0.4 or larger, light reception loss and transmission loss can be made less than those of the prior art can.

What is claimed is:

1. A method of producing a solar battery comprising, sequentially:

forming a semiconductor layer of a second conductivity type in a semiconductor substrate of a first conductivity type at a surface of the substrate;

forming an anti-reflective layer on the semiconductor layer;

forming a water-repellent layer on the anti-reflective layer;

forming a coated-film electrode by printing a coating solution containing an electrode material on the water-repellent layer; and forming a front electrode that penetrates the anti-reflective layer and is electrically connected to the semiconductor layer by firing the coated-film electrode, wherein the coating solution is suppressed from spreading over the water-repellent layer whereby the coated-film electrode has a narrow ridge shape.

2. The method of producing a solar battery according to claim 1, wherein the water-repellent layer is removed where the coated-film electrode is to be formed, before the coated-film electrode is formed.

3. The method of producing a solar battery according to claim 1, wherein the water-repellent layer is removed except directly below the coated-film electrode, after forming the coated-film electrode.

4. The method of producing a solar battery according to claim 1, wherein the water-repellent layer contains a fluorine-containing surfactant.

5. The method of producing a solar battery according to claim 1, wherein the water-repellent layer is removed by thermal decomposition during firing of the coated-film electrode.

* * * * *